(12) United States Patent
Garcia et al.

(10) Patent No.: US 8,594,609 B2
(45) Date of Patent: *Nov. 26, 2013

(54) DRAIN-PUMPED SUB-HARMONIC MIXER FOR MILLIMETER WAVE APPLICATIONS

(75) Inventors: Alberto Valdes Garcia, White Plains, NY (US); Chinmaya Mishra, College Station, TX (US); Scott Kevin Reynolds, Amawalk, NY (US)

(73) Assignee: International Business Machines Corporation, Armonk, NY (US)

( * ) Notice: Subject to any disclaimer, the term of this patent is extended or adjusted under 35 U.S.C. 154(b) by 122 days.

This patent is subject to a terminal disclaimer.

(21) Appl. No.: 13/046,377

(22) Filed: Mar. 11, 2011

(65) Prior Publication Data

US 2011/0183641 A1    Jul. 28, 2011

Related U.S. Application Data

(63) Continuation of application No. 11/622,812, filed on Jan. 12, 2007, now Pat. No. 7,962,114.

(51) Int. Cl.
*H04B 1/26* (2006.01)
*H03D 7/14* (2006.01)
*H04B 1/30* (2006.01)

(52) U.S. Cl.
CPC .............. *H03D 7/1441* (2013.01); *H04B 1/30* (2013.01)
USPC ............ 455/323; 455/326; 455/333; 327/122

(58) Field of Classification Search
USPC ................. 455/313, 317, 318, 323, 326, 333
See application file for complete search history.

(56) References Cited

U.S. PATENT DOCUMENTS

| 4,320,536 | A | | 3/1982 | Dietrich |
| 4,947,062 | A | * | 8/1990 | Weiner et al. ................. 327/113 |
| 5,319,267 | A | | 6/1994 | Kimura |
| 5,751,033 | A | | 5/1998 | Miya |
| 5,826,183 | A | | 10/1998 | Apel |
| 5,933,771 | A | | 8/1999 | Tiller et al. |
| 6,094,084 | A | | 7/2000 | Abou-Allam et al. |
| 6,144,236 | A | | 11/2000 | Vice et al. |
| 6,239,645 | B1 | | 5/2001 | Tsukahara et al. |
| 6,348,830 | B1 | | 2/2002 | Rebeiz et al. |
| 6,370,372 | B1 | | 4/2002 | Molnar et al. |

(Continued)

OTHER PUBLICATIONS

Bura, P., et. al., "FET mixers for communication satellite transponders," MTT-S International Microwave Symposium Digest, vol. 76, No. 1, pp. 90-92, Jun. 1976.

(Continued)

*Primary Examiner* — Duc M Nguyen
(74) *Attorney, Agent, or Firm* — Tutunjian & Bitetto, P.C.; Anne V. Dougherty

(57) ABSTRACT

A sub-harmonic mixer includes a first transistor having a source and a drain and a second transistor having a source connected to the source of the first transistor and a drain connected to the drain of the first transistor. A mixing transistor is configured to be biased in a linear operating region. The mixing transistor includes a drain coupled to the sources of the first transistor and the second transistor. The mixing transistor has its drain driven by a signal at twice a local oscillator (LO) frequency and its gate driven by a radio frequency (RF) signal while the mixing transistor is biased in the linear region such that a process of frequency doubling and mixing are performed simultaneously.

17 Claims, 6 Drawing Sheets

(56) References Cited

U.S. PATENT DOCUMENTS

| | | |
|---|---|---|
| 6,664,824 B2 | 12/2003 | Laws |
| 6,774,699 B1 | 8/2004 | Lin |
| 6,861,891 B2 | 3/2005 | Romano |
| 6,999,747 B2 | 2/2006 | Su |
| 7,062,247 B2 | 6/2006 | Kovacevic et al. |
| 7,589,579 B2 * | 9/2009 | Sanduleanu et al. .......... 327/359 |
| 7,982,527 B2 * | 7/2011 | Dawe et al. .................. 327/355 |
| 2001/0036818 A1 | 11/2001 | Dobrovolny |
| 2003/0036373 A1 * | 2/2003 | Yu et al. ........................ 455/333 |
| 2003/0119473 A1 | 6/2003 | Smith et al. |
| 2003/0169089 A1 * | 9/2003 | Manku et al. ................. 327/359 |
| 2003/0184378 A1 * | 10/2003 | Segawa ........................ 330/254 |
| 2004/0063419 A1 | 4/2004 | Molnar et al. |
| 2004/0121751 A1 | 6/2004 | Shen |
| 2004/0227559 A1 | 11/2004 | Erba et al. |
| 2004/0257129 A1 * | 12/2004 | Kwok ............................ 327/116 |
| 2007/0087721 A1 * | 4/2007 | Park et al. ..................... 455/333 |
| 2008/0284488 A1 | 11/2008 | Sanduleanu et al. |

OTHER PUBLICATIONS

Ellinger, F., et. al., "30-40GHz drain-pumped passive-mixer MMIC fabricated on VLSI SOI CMOS technology," IEEE Trans. on Microw. Theory and Tech., vol. 52, No. 5, pp. 1382-1391, May 2004.

Tsironis, C., et. al., "Dual-gate MESFET mixers," IEEE Trans. on Microw. Theory and Tech., vol. 32, No. 3, pp. 248-255, Mar. 1984.

Lee, S-Y, et. al., "Analysis and implementation of a CMOS even harmonic mixer with current reuse for heterodyne/direct conversion receivers," IEEE Trans. on Circuits and Systems-I, vol. 52, No. 9, pp. 1741-1751, Sep. 2005.

Yang, M-S, et. al., "Low power fully differential frequency doubler," IEE Electronics Letters, vol. 39, No. 19, pp. 1388-1389, Sep. 2003.

Yang, T-Y, et. al., "A 28 GHz sub-harmonic mixer using LO doubler in 0.18μm CMOS technology," IEEE RFIC Dig. of Technical Papers, Jun. 12-14, 2006, pp. 239-242.

* cited by examiner

DRAIN-PUMPED SUB-HARMONIC MIXER FOR MILLIMETER WAVE APPLICATIONS

CROSS-REFERENCE TO RELATED APPLICATIONS

This application is a continuation of U.S. patent application Ser. No. 11/622,812 filed Jan. 12, 2007 now U.S. Pat. No. 7,962,114, which is incorporated by reference herein in its entirety.

GOVERNMENT RIGHTS

This invention was made with Government support under Contract No.: N66001-05-C-8013 awarded by the DARPA—Defense Advanced Research Project Agency. The Government has certain rights in this invention.

BACKGROUND

1. Technical Field

The present invention relates to mixer circuits and more particularly to sub-harmonic mixers implemented in complementary metal oxide semiconductor (CMOS) technology.

2. Description of the Related Art

Mainstream complementary metal oxide semiconductor (CMOS) technology for millimeter wave applications is gaining attention primarily due to its low cost. However, as frequency of operation for these devices increases, for the circuits realized using this technology, it becomes challenging to minimize uncertainties arising due to incomplete device modeling and process variations at the increased frequencies.

A mixer is an important part of any super heterodyne radio architecture. The choice of mixer topology at millimeter wave frequencies depends heavily on the amount of local oscillator (LO) power available to drive the mixer. The power governs the key performance parameters such as conversion gain, noise figure and linearity.

At millimeter wave frequencies the available power from a CMOS device is low; hence, topologies of mixers desirable in a millimeter wave system should be limited to ones that can operate at lower LO power levels. It is also advantageous to have the LO source operating at a lower frequency (preferably a sub-harmonic of the required LO frequency to down convert the RF signal) because of ease of implementation, availability of better well-characterized passives and better phase noise and tuning range with less susceptibility to parasitics. Such a LO source could be followed by a multiplier to drive the mixer in the receive and transmit chain or it could be used to form an input to a sub-harmonic mixer (one that effectively uses a harmonic of the applied LO signal to perform the mixing).

Mixers using Schottky barrier diodes are sometimes preferred at millimeter wave frequencies because of their high cut-off frequencies in the THz range. A structure using an anti-parallel diode pair is commonly used to implement a sub-harmonic mixer. Fundamental mode mixers are also implemented using these diodes. Structures of this type have a serious drawback. They require large LO power. The conversion loss and noise figure degrade rapidly with reduction in LO power.

Among field effect transistor (FET) based mixers there are gate pumped and drain pumped mixers. In gate pumped mixers the radio frequency (RF) and LO signals are applied at the gate of a FET and the intermediate frequency (IF) signal is taken from the drain. The mixing occurs due to the non-linear variations of the FET transconductance ($g_m$) as a function of gate source voltage ($V_{gs}$). The FET is biased in the saturation region with $V_{gs}$ close to the threshold voltage of the FET ($V_{th}$).

In a drain pumped mixer, the LO signal is applied at the drain, the RF signal is applied at the gate and the IF signal is taken from the drain. The mixing action occurs due to the non-linear dependence of $g_m$ on the drain source voltage ($V_{ds}$). In this case, the FET is biased at the transition between linear and saturation regions where maximum non-linearities are generated.

The drain pumped mixer configuration has an advantage over its gate driven counterpart because of the inherent port isolation between the RF and LO frequencies. Further improvement to the drain pumped mixer topology results in a dual-gate mixer topology wherein the RF and LO signals are applied to different gates thereby further improving RF-LO isolation. Also, the noise figure in a drain pumped mixer is found to be lower than that of the gate driven mixer (where LO and RF signals are applied to the same gate terminal) because of the low DC bias current of the FET also implying a low power implementation.

There have been implementations for CMOS frequency doublers and drain pumped mixers driven by a fundamental LO signal or twice the LO signal generated by such a frequency doubler. In Yang, et. al., "A 28 GHz sub-harmonic mixer using LO doubler in 0.18 μm CMOS technology," IEEE RFIC Dig. Of Technical Papers, San Francisco, Calif., Jun. 12-14, 2006, pp: 239-242, a frequency doubler similar to one in Yang et. al., "Low power fully differential frequency doubler," IEEE Electronics Letters, vol. 39, no. 19, pp: 1388-1389, September 2003, is AC coupled to a RF transistor at its drain to form a sub-harmonic mixer. However, these devices suffer from serious drawbacks, e.g.: (i) the drain of the RF transistor is floating and hence the transistor is not biased properly at DC, (ii) the circuit suffers from high conversion loss as well as noise figure due to its complete passive implementation, (iii) the device is not suitable for very high frequency applications because of the stacked push-push NMOS/PMOS implementation which results in more parasitics at the LO port.

SUMMARY

A sub-harmonic mixer includes a first transistor having a source and a drain and a second transistor having a source connected to the source of the first transistor and a drain connected to the drain of the first transistor. A mixing transistor is configured to be biased in a linear operating region. The mixing transistor includes a drain coupled to the sources of the first transistor and the second transistor. The mixing transistor has its drain driven by a signal at twice a local oscillator (LO) frequency and its gate driven by a radio frequency (RF) signal. The mixing transistor is biased in the linear region such that a process of frequency doubling and mixing is performed simultaneously.

Another sub-harmonic mixer includes n transistors, each having, a gate, a source and a drain, such that the sources are all connected and the drains are all connected. Each of the n transistors includes a local oscillator (LO) frequency input to the gate of the transistors where the LO signal is 360/n out of phase for each successive transistor. A mixing transistor is configured to be biased in a linear operating region, and the mixing transistor has a drain coupled to the sources of the n transistors. The mixing transistor has its drain driven by a signal at a multiple of the local oscillator (LO) frequency in accordance with the n transistors and has its gate driven by a radio frequency (RF) signal while the mixing transistor is biased in the linear region such that a process of providing an output frequency and mixing are performed simultaneously.

A differential complementary metal oxide semiconductor (CMOS) sub-harmonic mixer includes a first mixer circuit configured to receive a first differential input for a radio frequency (RF) signal and a first differential input for a local oscillator (LO) frequency signal. A second mixer circuit is configured to receive a second differential input for the radio frequency (RF) signal and a second differential input for the frequency signal. The first mixer circuit and the second mixer circuit each include a first transistor having a source and a drain; a second transistor having a source connected to the source of the first transistor and a drain connected to the drain of the first transistor; and a mixing transistor configured to be biased in a linear operating region. The mixing transistor has a drain coupled to the sources of the first transistor, and the second transistor has its drain driven by a signal at twice a local oscillator (LO) frequency and its gate driven by a corresponding differential radio frequency (RF) signal while the mixing transistor is biased in the linear region such that a process of frequency doubling and mixing are performed simultaneously.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
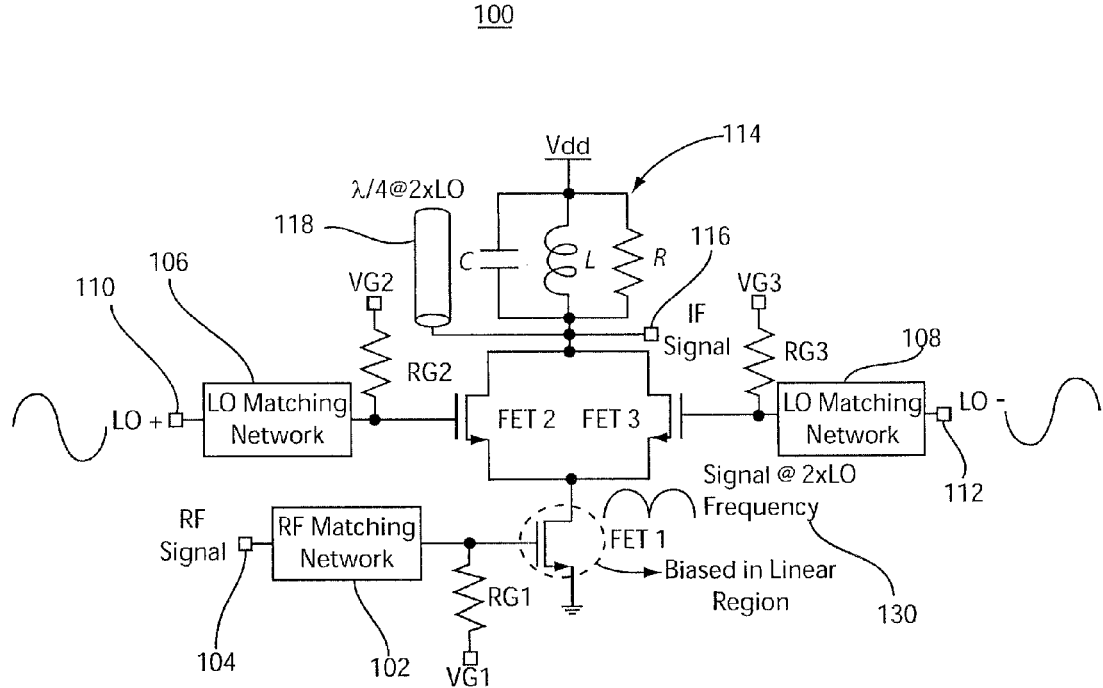
FIG. 1 is a schematic diagram showing a CMOS drain pumped 2× sub-harmonic mixer in accordance with one embodiment.

A complementary metal oxide semiconductor (CMOS) sub-harmonic mixer for millimeter wave applications is described. While the illustrative embodiments described herein are directed to a CMOS mixer the same design principles can be applied for mixers implemented with MESFETs, JFETs or other technologies as well. In one embodiment, the mixer uses three MOS transistors stacked under a single supply (Vdd) to perform the process of frequency doubling as well as mixing. The mixing occurs in a single MOS transistor whose drain is driven by a signal at twice the local oscillator (LO) frequency and the gate driven by a radio frequency (RF) frequency signal while the transistor is biased in the linear region.

The CMOS sub-harmonic mixer in accordance with the present principles utilizes the differential nature of the available LO signal from a voltage controlled oscillator or other RF signal source to generate a signal at twice the available LO frequency using two MOS transistors only, thereby reducing the design complexity and operating frequency of the LO source. This signal at twice the frequency drives the drain of a MOS transistor operating in the linear region with a very low drain to source voltage as in a drain pumped mixer. The mixing occurs due to the modulation of the transconductance of the MOS transistor by the signal at twice the LO frequency. The frequency doubling action takes place using two field effect transistors (FETs) whose drain and source are tied together while there gates are driven by a balanced LO.

The circuit presents inherent advantages over prior art including, but not limited to: (i) the mixing transistor is biased in the linear region without any additional DC current (it uses the DC current of the doubler) thereby providing higher conversion gain compared to a passive drain pumped mixer, and (ii) the drain pumped mixer is biased in the linear region so that the LO power needed to drive the transistor from the linear to saturation region is very small.

According to another embodiment, the structure may be modified to accept a balanced radio frequency (RF) signal which is either provided via a transformer from a single ended low noise amplifier (LNA) or it is directly coupled to the output of a differential LNA. This helps in improving 2×LO-RF isolation as the 2×LO signal appears in the same phase on the differential RF lines.

According to another embodiment, quadrature signals are employed to drive the gates of four FETs whose drains and sources are tied together to result in a signal at the source and drain equal to 4 times the applied frequency thereby resulting in a 4× sub-harmonic mixer. The amount of voltage swing at the drain of a first FET is less than that of a 2× sub-harmonic mixer due to the overlapping of the signals during the positive and negative cycles. Hence, conversion loss would be greater for the same LO power at the gates.

According to yet another embodiment, an impedance transforming network is introduced in between the mixing FET and the frequency doubling FETs to increase the doubling efficiency at high frequency of operation. This permits larger voltage swings at the drain of the mixing FET at higher frequencies thereby improving the mixer performance such as noise figure and conversion gain.

It should be understood that the structures or circuits described herein may be implemented in different technologies. One illustrative technology may include, e.g., IBM® CMOS10SF™ technology with a channel length of 50 nm. The drain source saturation voltage for FETs in these process technologies is very small hence they can be biased very deeply in the linear region drawing very little DC current. The voltage swing on the drain would hence be enough to move the FET's region of operation from linear to saturation (maximum $g_m$). This biasing results in significant power savings and provides improvement in noise figure. The loss exhibited by these circuits is improved as compared to Gilbert-cell based active mixers. In addition, the power saved could be employed in an IF amplifier to provide gain at IF frequencies.

Another advantage of these structures in accordance with the present embodiments includes that the structures relax the design of the LO source which may be a voltage controlled oscillator (VCO) and use differential signals from the VCO directly without the need of any transformer to provide the differential signals. By reducing the fundamental frequency of the VCO, traditional cross coupled FET VCOs could be used which have better phase noise and are inherently differential.

The present embodiments may also be modified to operate as an up-conversion mixer where the input to the FET would be an IF signal. However, to filter the LO signal properly from the RF signal, the IF signal needs to be at a higher frequency such that RF and LO are fairly separated.

Embodiments of the present invention can take the form of an entirely hardware embodiment, an entirely software embodiment (e.g., implemented in circuit simulation programs) or an embodiment including both hardware and software elements. In a preferred embodiment, the present invention is implemented in hardware, but a software implemented embodiment may include but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that may include, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

Circuits as described herein may be part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage Medium storing the design) or electronically (e.g., through the Internet) to such entities, directly or indirectly. The stored design is then converted into the appropriate format (e.g., Graphic Data System II (GDSII)) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIG. 1, a drain pumped 2× sub-harmonic mixer 100 is shown in accordance with one embodiment. A transistor FET 1 performs mixing and operates in a drain pumped mode while biased in a linear region. Transistors FET 2 and FET 3 (which are identical to each other) perform the process of frequency doubling and are directly coupled to the drain of FET 1. Gate voltages (VG1, VG2, and VG3) and gate resistances (RG1, RG2 and RG3) respectively correspond to FETs 1, 2 and 3. Vdd is the supply voltage of mixer 100.

The sources and drains of FET 2 and FET 3 are respectively tied together. Since FET 2 and FET 3 are driven by equal and opposite phase signals each of them conducts during half of the cycle. This results in a conduction rate of twice the rate of an applied frequency.

This operation eliminates all fundamental and odd ordered harmonics at the source and drain of FET 2 and FET 3 if the conduction in both of FET 2 and FET 3 is identical. This provides higher LO-RF and LO-IF isolation.

FET 1 is biased in its linear region such that the drain source voltage is very low (e.g., a few milli-volts) and the gate source voltage is slightly above threshold to have a maximum change in $g_m$. This also permits the non-linear characteristics of $g_m$ to predominate that of the drain source resistance. FET 2 and FET 3 are preferably biased in the saturation region with their gate-source voltage ($V_{gs}$) very close to the threshold voltage ($V_{th}$).

An RF matching network 102 is employed to match an RF port 104 so as to have maximum power transfer at the RF frequency. LO matching networks 106 and 108 are employed on LO ports 110 and 112 to provide maximum LO power transfer at the LO frequency. This determines the maximum swing at the drain node of FET 1. A parallel RLC network 114 is used to provide DC bias as well as to tune out an intermediate frequency (IF) signal 116. At the drain node, a quarter wavelength (at twice the LO frequency) transmission line stub 118 is used to provide 2×LO-IF isolation. If the RF frequency is close to twice the LO frequency, this stub 118 also improves RF-IF isolation.

Advantageously, the mixer 100 uses three transistors FET 1, FET 2 and FET 3 which may be stacked under a single supply to perform the process of frequency doubling as well as mixing. The mixing occurs in FET 1 whose drain is driven by a signal at twice the local oscillator (LO) frequency and the gate driven by a radio frequency (RF) frequency signal while the transistor is biased in the linear region.

The CMOS sub-harmonic mixer 100 utilizes the differential nature of the available LO signal 110 and 112 from a voltage controlled oscillator (not shown) to generate a signal at twice the available LO frequency using FET 2 and FET 3, thereby reducing the design complexity of the LO frequency source. A signal 130 at twice the frequency of LO signal drives the drain of FET 1 operating in the linear region with a very low drain to source voltage as in a drain pumped mixer. The mixing occurs due to the modulation of the transconductance of FET 1 by the signal 130 at twice the LO frequency. The frequency doubling action takes place using FET 2 and FET 3 whose drain and source are tied together while their gates are driven by the balanced LO.

The circuit 100 provides a higher conversion gain compared to a passive drain pumped mixer since the mixing transistor FET 1 is biased in the linear region without any additional DC current (it uses the DC current of the doubler). The passive drain pumped mixing transistor FET 1 is biased in the linear region so that the LO power needed to drive the transistor from the linear to saturation region is very small.

Figure 2:
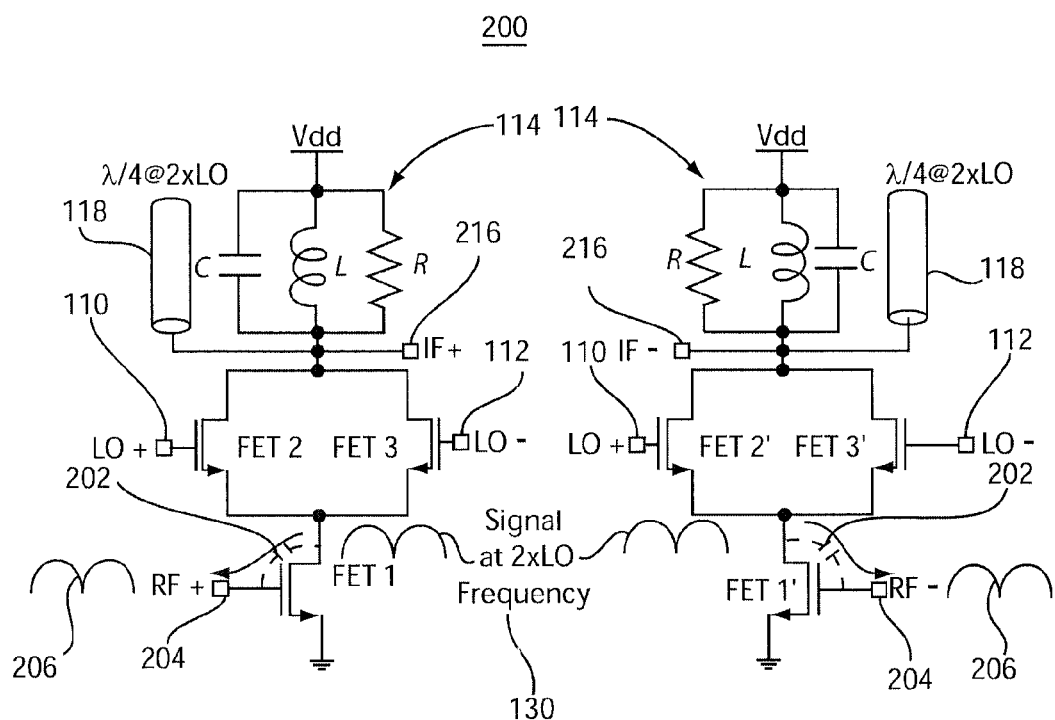
FIG. 2 is a schematic diagram showing a differential input/output 2× sub-harmonic mixer with high 2×LO-RF isolation in accordance with another embodiment.

Referring to FIG. 2, a CMOS drain pumped 2× sub-harmonic mixer 200 is illustratively shown in accordance with another embodiment. Mixer 200 includes two of the circuits 100 as depicted shown in FIG. 1, however, RF ports 204 (+ and −) and LO ports 110 and 112 (+ and −) are differential signals (inputs). The structure 200 is modified from that of circuit 100 to accept a balanced radio frequency (RF) signal which is either provided via a transformer from a single ended low noise amplifier (LNA) (not shown) or it is directly coupled to the output of a differential LNA (not shown). This helps in improving 2×LO-RF isolation as the 2×LO signal appears in the same phase on the differential RF lines. The mixer takes information from the LNA in the RF ports (input) 204 and down-converts it to the IF ports 216 (output).

FETs 1, 2 and 3 are identical to FETS 1', 2' and 3'. The differential inputs 204 and 110 and 112 assist in improving 2×LO-RF isolation as a signal 206 at twice the LO frequency leaking through a gate-drain capacitance 202 of the RF transistors FET 1 and FET 1' appears as common-mode signals on the differential RF lines 104 (+ and −) and hence is rejected. A transformer may be needed at the output of a low noise amplifier (LNA) (not shown) in a millimeter wave transceiver or the LNA might have to be differential in implementation.

Another advantage of this structure 200 includes the availability of differential IF signals 216 which would permit low frequency differential IF signal processing without undergoing a single ended to differential conversion. The 2×LO signal 130 also appears in common mode at the output which is further rejected by differential IF processing blocks (not shown).

Figure 3:
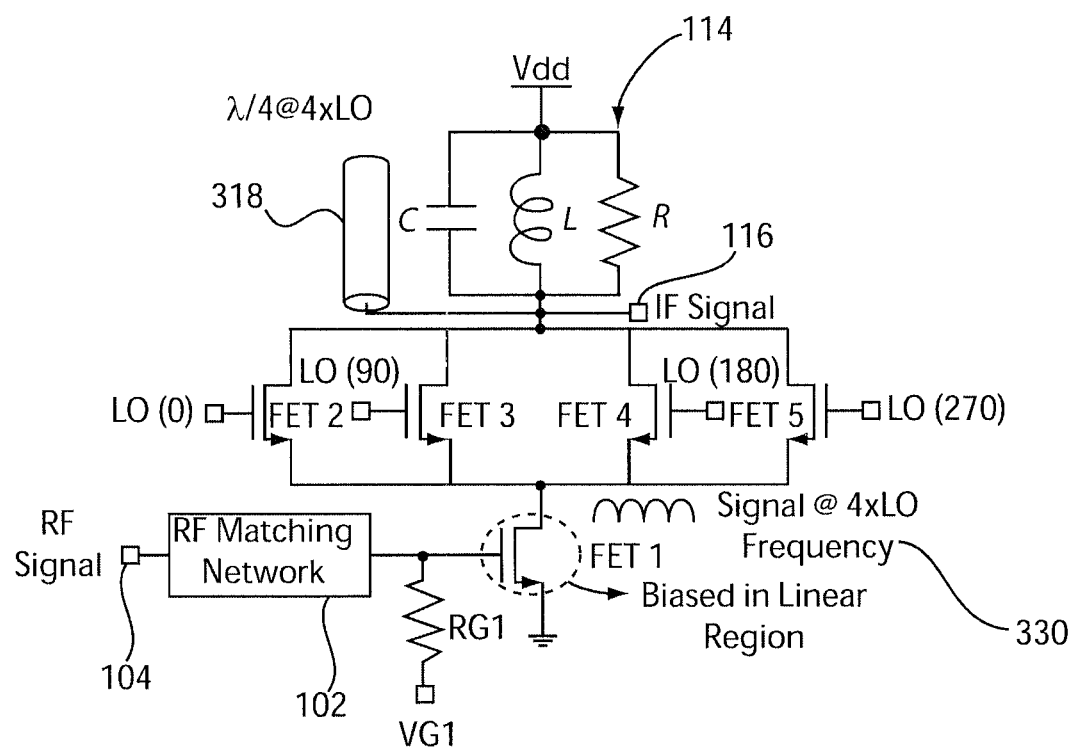
FIG. 3 is a schematic diagram showing a CMOS drain pumped 4× sub-harmonic mixer in accordance with another embodiment.

Referring to FIG. 3, a CMOS drain pumped 4× sub-harmonic mixer 300 is illustratively shown in accordance with another embodiment. Mixer 300 illustratively uses four FETs: FET 2, FET 3, FET 4 and FET 5 with common source and drain nodes. FETS 2, 3, 4 and 5 are driven by local oscillator signals LO(0), LO(90), LO(180), and LO(270), respectively), which are 90 degrees in phase apart from each other. Because of the overlapping nature of the quadrature signals, a signal 330 at 4 times the LO frequency appearing at the source and drain node is small compared to its 2× counterpart (130). However, the fundamental LO (VCO) frequency is reduced by another factor of 2. A quarter wavelength (at 4× LO) open transmission line stub 318 at the output greatly improves 4LO-IF isolation.

The quadrature signals LO(0), LO(90), LO(180), and LO(270) are employed to drive the gates of the FETs to result in the signal 330 at the source and drain equal to 4 times the applied frequency thereby resulting in a 4× sub-harmonic mixer. The amount of voltage swing at the drain of FET 1 is less than that of a 2× sub-harmonic mixer due to the overlapping of the signals during the positive and negative cycles. Hence, conversion loss would be greater for the same LO power at the gates.

It should be understood that any number of transistors may be employed in circuit 300. In the example shown, four transistors were employed to provide a phase difference of 90. However, if n transistors are employed then each signal has to be 360/n out of phase for each successive transistor.

Figure 4:
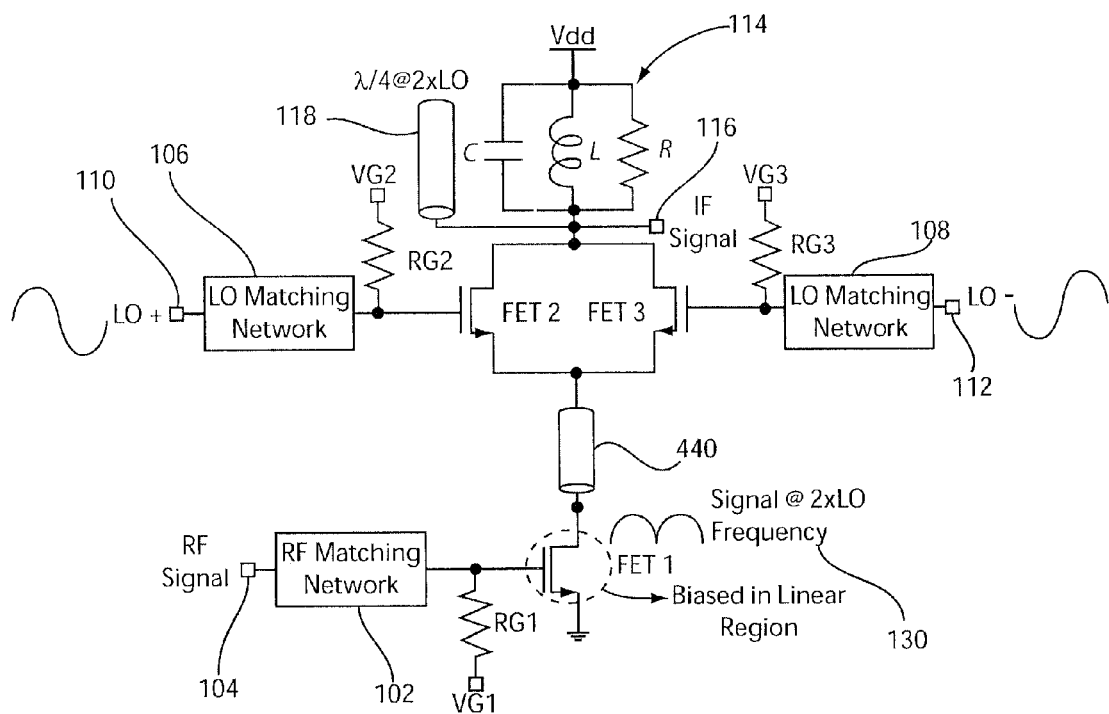
FIG. 4 is a schematic diagram showing a CMOS sub-harmonic mixer with an inter-stage transmission line stub in accordance with another embodiment.
Figure 5:
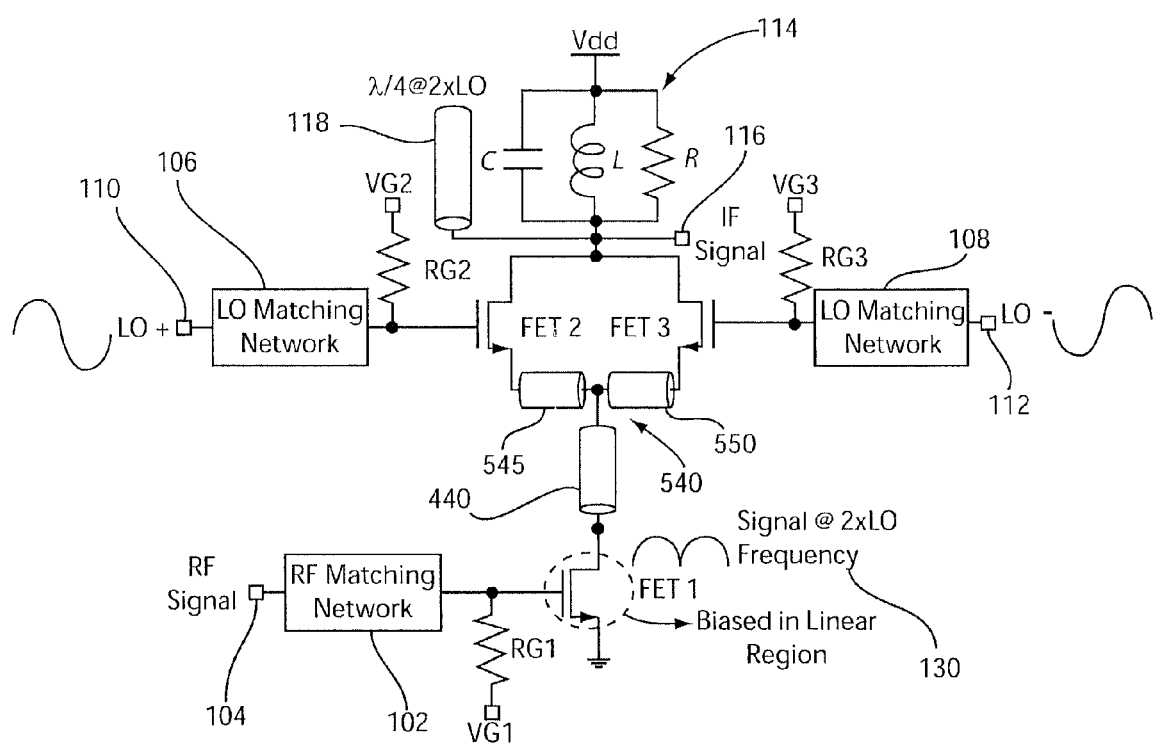
FIG. 5 is a schematic diagram showing a CMOS sub-harmonic mixer with a distributed inter-stage impedance transformation network in accordance with another embodiment.
Figure 6:
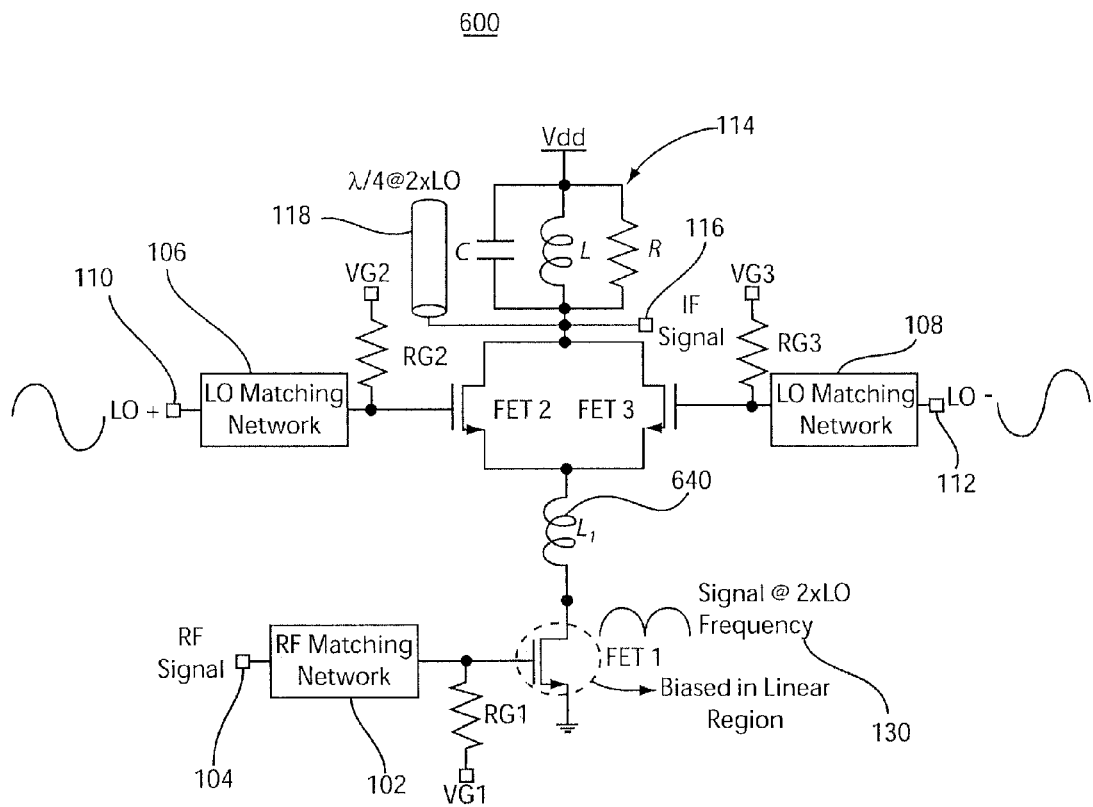
FIG. 6 is a schematic diagram showing a CMOS sub-harmonic mixer with inter-stage inductor in accordance with another embodiment.

Referring to FIGS. 4, 5 and 6, a CMOS drain-pumped sub-harmonic mixers 400, 500 and 600, respectively, with an impedance transforming network or component (440, 540, 640) introduced in between a mixing FET 1 and the frequency doubling FETs, FET 2 and FET 3, to increase the doubling efficiency at a high frequency of operation are illustratively shown. These structures (440, 540, 640) permit larger voltage swings at the drain of the mixing FET 1 at higher frequencies thereby improving the mixer performance such as noise figure and conversion gain.

In FIG. 4, an inter-stage transmission line stub 440 is illustratively depicted. The transmission line stub 440 acts like an impedance transforming network which increases the voltage swing at the drain of FET 1 thereby improving the noise figure and power gain. A transmission line (440) of a certain length isolates the capacitance at the sources of FET 2 and FET 3 and that at the drain of FET 1. The voltage swing at the source of FET 2 and FET 3 is lower than that at the drain of FET 1, suggesting an impedance transformation.

In FIG. 5, the mentioned impedance transformation between the drain of FET 1 and the sources of FET 2 and FET 3 is performed by individual transmission lines 545 and 550 between each source of the switching transistors and the drain of FET 1. These transmission lines 545 and 550 can be used in addition to or instead of a transmission line at the drain of FET 1 440 to realize the optimum impedance transformation.

In FIG. 6, depending on the needed value of inductance to transform the capacitive impedance (looking into the drain of FET 1) at 2×LO frequency into an inductive one, an inductor 640 may also be employed provided the inductor has sufficiently large self resonant frequency, e.g., a self resonant frequency greater than the 2×LO frequency. Such a structure 600 is illustratively shown in FIG. 6.

Impedance transforming networks 440, 540 or 640 may also be employed in a 4× sub-harmonic mixer (e.g., mixer 300). In such a case, the network or inductor 640 would need a resonant frequency greater than the 4×LO frequency. Impedance transformation may be employed with any of the embodiments in accordance with the present principles. For example, impedance transformation would be more necessary in the 4× sub-harmonic mixer due to the increased parasitics associated therewith. The impedance transformation would improve the efficiency of the doubling (or quadrupling) action as well as the performance of the overall mixer. Any of the impedance transformation schemes depicted may be combined in whole or in part as needed.

Having described preferred embodiments for drain-pumped sub-harmonic mixers for millimeter wave applications (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A sub-harmonic mixer comprising,
a first transistor having a source and a drain;
a second transistor having a source connected to the source of the first transistor and a drain connected to the drain of the first transistor;
a mixing transistor configured to be biased in a linear operating region, the mixing transistor having a drain coupled to the sources of the first transistor and the second transistor, the mixing transistor having its drain driven by a signal at twice a local oscillator (LO) frequency and its gate driven by a radio frequency (RF) signal while the mixing transistor is biased in the linear region such that a process of frequency doubling and mixing are performed simultaneously,
wherein the drains of the first transistor and the second transistor are coupled to a transmission line stub to provide isolation between a doubled local oscillator (LO) frequency signal and an intermediate frequency (IF) signal and wherein the drains of the first transistor and the second transistor are coupled to a parallel RLC network to provide direct current (DC) bias and to tune out the IF signal.

2. The mixer as recited in claim 1, further comprising an impedance transforming network connected between the mixing transistor and the first and second transistors to increase doubling efficiency and permit larger voltage swings at the drain of the mixing transistor to improve performance.

3. The mixer as recited in claim 2, wherein the impedance transforming network includes one of an inductor or a transmission line stub.

4. The mixer as recited in claim 1, wherein the first and second transistors include gates driven by a balanced local oscillator signal.

5. The mixer as recited in claim 1, wherein any transistor sources that are coupled to the drain of the mixing transistor are only the sources of the first and second transistors.

6. The mixer as recited in claim 1, wherein linearization of the mixing transistor so that the mixing transistor operates in the linear operating region is implemented only through at least one of the drain of the mixing transistor or the gate of the mixing transistor.

7. A sub-harmonic mixer comprising:
n transistors, each having, a gate, a source and a drain, such that the sources are all connected and the drains are all connected,
each of the n transistors having a local oscillator (LO) frequency input to the gate of the transistors where the LO signal is 360/n out of phase for each successive transistor;
a mixing transistor configured to be biased in a linear operating region, the mixing transistor having a drain coupled to the sources of the n transistors, the mixing transistor having its drain driven by a signal at a multiple of the local oscillator (LO) frequency in accordance with the n transistors and the mixing transistor having its gate driven by a radio frequency (RF) signal while the mixing transistor is biased in the linear region such that a process of providing an output frequency and mixing are performed simultaneously,
wherein the drains of the n transistors are coupled to a transmission line stub to provide isolation between a multiple local oscillator (LO) frequency signal and an intermediate frequency (IF) signal and wherein the drains of the n transistors are coupled to a parallel RLC network to provide direct current (DC) bias and to tune out the IF signal.

8. The mixer as recited in claim 7, further comprising an impedance transforming network connected between the mixing transistor and the n transistors to increase efficiency and permit larger voltage swings at the drain of the mixing transistor to improve performance.

9. The mixer as recited in claim 8, wherein the impedance transforming network includes one of an inductor or a transmission line stub.

10. The mixer as recited in claim 7, wherein the n transistors includes four transistors and the output frequency is four times the LO frequency.

11. The mixer as recited in claim 7, wherein any transistor sources that are coupled to the drain of the mixing transistor are only the sources of the n transistors.

12. The mixer as recited in claim 7, wherein linearization of the mixing transistor so that the mixing transistor operates in the linear operating region is implemented only through at least one of the drain of the mixing transistor or the gate of the mixing transistor.

13. A differential complementary metal oxide semiconductor (CMOS) sub-harmonic mixer, comprising,
a first mixer circuit configured to receive a first differential input for a radio frequency (RF) signal and a first differential input for a local oscillator (LO) frequency signal;
a second mixer circuit configured to receive a second differential input for the radio frequency (RF) signal and a second differential input for the frequency signal;
the first mixer circuit and the second mixer circuit each including:
a first transistor having a source and a drain;
a second transistor having a source connected to the source of the first transistor and a drain connected to the drain of the first transistor;
a mixing transistor configured to be biased in a linear operating region, the mixing transistor having a drain coupled to the sources of the first transistor and the second transistor, the mixing transistor having its drain driven by a signal at twice a local oscillator (LO) frequency and its gate driven by a corresponding differential radio frequency (RF) signal while the mixing transistor is biased in the linear region such that a process of frequency doubling and mixing are performed simultaneously,
wherein the drains of the first transistor and the second transistor in each of the first mixing circuit and the second mixing circuit are coupled to a transmission line stub to provide isolation between a doubled local oscillator (LO) frequency signal and an intermediate frequency (IF) signal and wherein the drains of the first transistor and the second transistor in each of the first mixing circuit and the second mixing circuit are coupled to a parallel RLC network to provide direct current (DC) bias and to tune out the IF signal.

14. The mixer as recited in claim 13, further comprising an impedance transforming network connected between the mixing transistor and the first and second transistors in each of the first mixing circuit and the second mixing circuit to increase doubling efficiency and permit larger voltage swings at the drain of the mixing transistor to improve performance.

15. The mixer as recited in claim 13, wherein the first and second transistors in each of the first mixing circuit and the second mixing circuit include gates driven by a balanced local oscillator signal.

16. The mixer as recited in claim 13, wherein any transistor sources that are coupled to the drain of the mixing transistor are only the sources of the first and second transistors.

17. The mixer as recited in claim 13, wherein linearization of the mixing transistor so that the mixing transistor operates in the linear operating region is implemented only through at least one of the drain of the mixing transistor or the gate of the mixing transistor.

\* \* \* \* \*